United States Patent
Saran et al.

[11] Patent Number: 5,998,296
[45] Date of Patent: Dec. 7, 1999

[54] METHOD OF FORMING CONTACTS AND VIAS IN SEMICONDUCTOR

[75] Inventors: Mukul Saran, Richardson; James F. Garvin, Jr., Carrollton; Wei-Yung Hsu, Dallas, all of Tex.

[73] Assignee: Texas Instruments Incorporated, Dallas, Tex.

[21] Appl. No.: 08/840,832

[22] Filed: Apr. 16, 1997

[51] Int. Cl.[6] .................................................. H01L 21/283
[52] U.S. Cl. .......................... 438/685; 438/629; 438/625; 438/648; 438/688; 438/637
[58] Field of Search ................................ 438/685, 625, 438/629, 636, 637, 638, 639, 642, 643, 666–668, 648, 652, 653, 674, 675

[56] References Cited

U.S. PATENT DOCUMENTS

| | | | |
|---|---|---|---|
| 5,073,518 | 12/1991 | Doan et al. | 438/618 |
| 5,266,521 | 11/1993 | Lee et al. | 438/642 |
| 5,312,775 | 5/1994 | Fujii et al. | 438/625 |
| 5,412,250 | 5/1995 | Brugge | 438/643 |
| 5,432,732 | 7/1995 | Ohmi | 257/304 |
| 5,471,084 | 11/1995 | Suzuki et al. | 257/421 |
| 5,488,014 | 1/1996 | Harada et al. | 438/625 |
| 5,534,463 | 7/1996 | Lee et al. | 438/643 |
| 5,580,823 | 12/1996 | Hegde et al. | 438/648 |
| 5,610,103 | 3/1997 | Xu et al. | 438/800 |
| 5,613,296 | 3/1997 | Kurino et al. | 427/96 |

*Primary Examiner*—Charles Bowers
*Assistant Examiner*—Thanh Nguyen
*Attorney, Agent, or Firm*—Peter K. McLarty; W. James Brady, III; Richard L. Donaldson

[57] ABSTRACT

A method of filling openings (20, 50) in a semiconductor (10, 40) includes the steps of first forming a fill metal layer (30, 60) over the semiconductor which substantially covers the openings (20, 50). Thereafter, a surface coating (32, 62, 64) of a predetermined material is formed over the fill metal layer (30, 60). Then, high pressure is applied on the surface coating (32, 62, 64) to force the fill metal into the openings (20, 50). Metal film surface cracks previously plaguing force-fill processes are thereby eliminated or substantially reduced.

20 Claims, 1 Drawing Sheet

METHOD OF FORMING CONTACTS AND VIAS IN SEMICONDUCTOR

TECHNICAL FIELD OF THE INVENTION

This invention is related in general to the field of semiconductor processing. More particularly, the invention is related to a method of forming contacts and vias in semiconductor.

BACKGROUND OF THE INVENTION

A challenge for semiconductor processing engineers is the formation of submicron contacts and vias with high aspect ratios. Forming the contacts and vias with aluminum is preferred over tungsten because of aluminum's lower resistance, fewer overall process steps, and improved electromigration performance. However, aluminum reflow for contact or via filling has not been widely accepted due to the higher deposition temperature and difficulty in completely filling the high aspect ratio contacts and vias. With the advent of a force-fill™ process developed by Electrotech Ltd. of Bristol, United Kingdom, a metal, typically aluminum, sputtered onto the semiconductor surface can be forcibly extruded into the small via or contact openings by exerting high pressure at an elevated temperature. Although this force-fill™ process enhances the filling of the via and contact recesses and openings, the force-fill process also creates substantial cracks or splits in the metal film surface.

The fill metal surface splitting or cracking is similar in appearance to the cracks in dry parched earth. The cracks may extend substantially into the metal film as to interfere with the conduction of current therethrough. Further, particulate defects and process induced defects on patterned silicon wafers are generally detectable with the use of optical defect detection equipment and laser scatter defect detection equipment. However, the detection equipment is more likely to generate erroneous detection results due to the grain boundary cracks. These cracks trap a large percentage of the incident light or laser, which causes them to appear as dark and ragged-edged lines. These dark lines are detected by the optical and laser scatter equipment as nuisance defects, making detection of true particulate defects difficult without significantly reducing the effective sensitivity of the equipment.

SUMMARY OF THE INVENTION

Accordingly, there is a need for a processing method that would completely fill the contacts and vias but substantially eliminate the fill metal surface cracks and/or splits.

In accordance with the present invention, a semiconductor processing method of forming contacts and vias is provided which eliminates or substantially reduces the disadvantages associated with prior methods.

In an aspect of the invention, a method of filling openings in a semiconductor includes the steps of first forming a fill metal layer over the semiconductor which substantially covers the openings. Thereafter, a surface coating of a predetermined material is formed over the fill metal layer. Then, high pressure is applied on the surface coating to force the fill metal into the openings.

An advantage of the present invention is the elimination or great reduction of cracking and splitting in the contact and via fill metal film surface. As a result, the conductivity of the metal film is enhanced and nuisance defects detected by semiconductor inspection equipment is substantially reduced. The narrowings of the linewidth that may occur due to such surface cracks can also affect electromigration reliability of leads carrying the vias. This invention additionally results in improved reliability.

BRIEF DESCRIPTION OF THE DRAWINGS

For a better understanding of the present invention, reference may be made to the accompanying drawings, in which.

DETAILED DESCRIPTION OF THE INVENTION

Figure 1A:
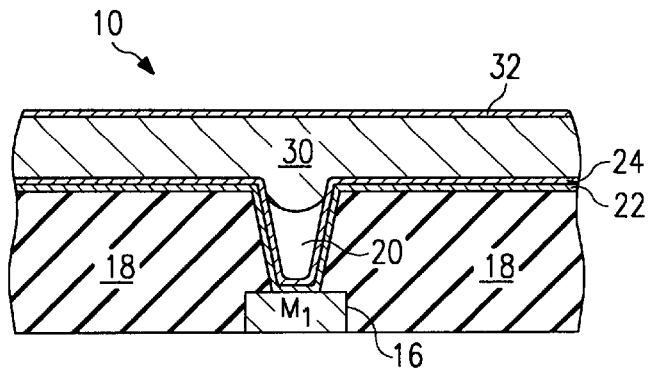
FIGS. 1A and 1B are cross-sectional views of a semiconductor process to eliminate fill metal surface cracks according to the teachings of the present invention.

The preferred embodiments of the present invention are illustrated in FIGS. 1–2, like reference numerals being used to refer to like and corresponding parts of the various drawings.

Referring to FIG. 1A, a cross-sectional view of an upper surface of a wafer 10 is shown. A metal layer or structure 16, $M_1$, is embedded in an inter-level oxide 18. An opening 20 to metal layer 16 may be created in inter-level oxide 18 by conventional processes, such as patterning and etching. Thereafter, one or more barrier/adhesion layers 22 and 24 may be formed on the bottom and sidewalls of recess or opening 20. The use of barrier/adhesion layers 22 and 24 enhances void-free plug formation and facilitates the deformation of the fill metal into opening 20. Barrier/adhesion layers 22 and 24 may be formed by depositing a titanium layer 22 and then a titanium nitride layer 24 thereon, for example. A typical thickness of titanium layer 22 is approximately 400 Å and of titanium nitride layer 24 is approximately 500 Å.

Subsequently, a layer of fill metal 30 is formed on the surface of wafer 10, completely covering and bridging opening 20. Fill metal 30 may be aluminum, aluminum alloy, or any other suitable conductor, and may be deposited by sputtering thereon at approximately 400–450° C. The thickness of fill metal layer 30 may be equal to or greater than the diameter of opening 20, which may be approximately 1 μm. In the conventional force-fill process, pressure ranging from 400 to 700 atmospheres is then applied isostatically to force fill metal 30 to enter and fill opening 20. However, as set forth above, this process results in cracking and splitting over the fill metal surface.

According to the teachings of the present invention, prior to the force-fill step, a thin surface coating layer 32 is formed on top of fill metal layer 30. Surface coating layer 32 may be formed by depositing an anti-reflective coating (ARC) of titanium nitride, titanium tungsten, silicon nitride, or other suitable metal on top of fill metal layer 30. Alternatively, surface coating layer 32 may be formed by exposing fill metal layer 30 to ambient air to form an oxide of the fill metal, for example. A surface coating layer 32 of nitride of the fill metal may also be formed by introducing nitrogen. When the fill metal is aluminum, its exposure to oxygen causes the formation of aluminum oxide, and exposure to nitrogen produces aluminum nitride. Surface coating layer 32 formed by depositing the anti-reflective coating may have a thickness less than 1000 Å and generally in the range of 50–500 Å. On the other hand, the oxide or nitride surface coating layer 32 may have a thickness of approximately 10–50 Å.

Figure 1B:
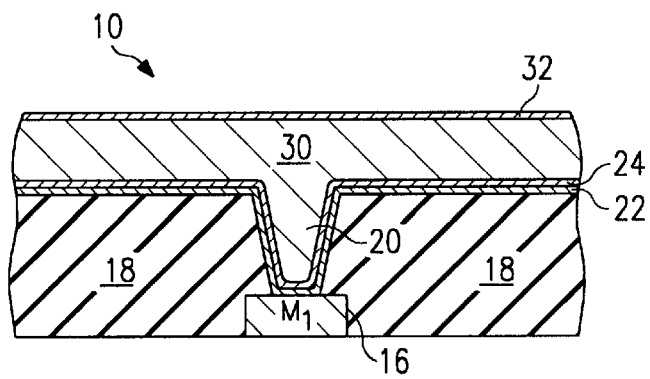

After the formation of surface coating layer 32, pressure is exerted isostatically on surface coating layer 32 which overlies fill metal layer 30. The pressure forces the fill metal to descend into opening 20 and substantially fills the void therein, as shown in FIG. 1B.

Figure 2A:
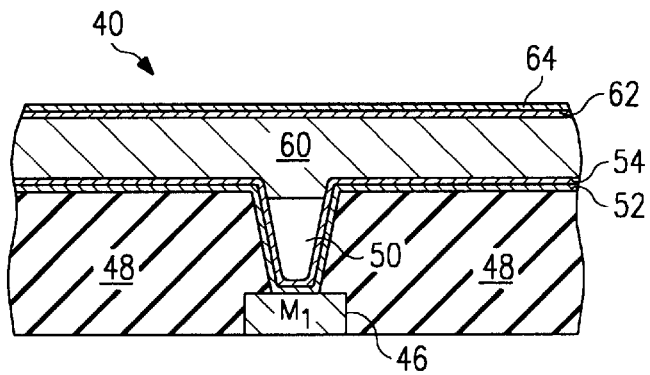
FIGS. 2A and 2B are cross-sectional views of an alternate semiconductor process to eliminate fill metal surface cracks according to the teachings of the present invention.

Referring to FIG. 2A, an alternate embodiment of the present invention is shown. A metal layer or structure 46, $M_1$, is embedded in an inter-level oxide 48. An opening 50 to metal layer 46 in inter-level oxide 48 may be created by patterning and etching. One or more barrier/adhesion layers 52 and 54 may be formed on the bottom and sidewalls of opening 50. As described above, barrier/adhesion layers 52 and 54 may be formed by depositing titanium and then titanium nitride, for example. A typical thickness of titanium layer 22 is approximately 400 Å and of titanium nitride layer 24 is approximately 500 Å.

A layer of fill metal 60 is then formed on the surface of wafer 40, completely covering and bridging opening 50. Fill metal 60 may be aluminum, aluminum alloy, or any other suitable conductor, and may be deposited by sputtering at approximately 400–450° C.

According to the teachings of the present invention, prior to the force-fill step, a first surface coating layer 62 is formed on top of fill metal layer 60. First surface coating layer 62 is preferably titanium. On top of first surface coating layer 62 a second surface coating layer 64 is formed. Second surface coating layer 64 may be formed by depositing an anti-reflective coating (ARC) of titanium nitride, titanium tungsten, silicon nitride, or other suitable metal on top of first surface coating layer 62. Alternatively, surface coating layer 64 may be formed by exposing first surface coating layer 62 to ambient air to form an oxide or by exposing to nitrogen to form a nitride, for example. The combined thickness of first and second surface coating layers 62 and 64 may be no more than 1000 Å. This is a typical thickness range but the invention is not so limited.

Figure 2B:
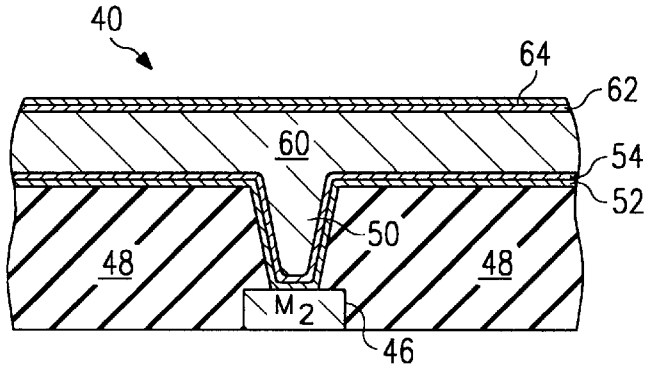

After the formation of surface coating layers 62 and 64, pressure is exerted isostatically thereon. The high pressure forces the fill metal to descend into opening 50 and substantially fills the void therein, as shown in FIG. 2B.

When contacts and vias are formed in the manner described above according to the teachings of the present invention, the surface coating layer or layers tend to hold the fill metal grains together or minimize the shear forces exerted thereon due to the high force-fill pressure. Accordingly, cracking and splitting in the fill metal surface are greatly reduced or eliminated. When an anti-reflective coating is used as a surface coating layer of the present invention, no process step is added since the application of the anti-reflective coating normally occurs subsequently in wafer processing.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A method of filling contacts and vias, comprising the steps of:
   (a) forming openings in an interlevel dielectric film, by forming the openings to have a plurality of side surfaces and a bottom surface;
   (b) forming at least one metal film of a first material on the interlevel dielectric film where the metal film covers the openings and does not substantially enter the openings;
   (c) forming at least one surface coating film of a second material different from the first material over the metal film said surface coating film having the property of minimizing shear forces exerted on the metal film; and
   (d) applying pressure greater than atmospheric pressure to the surface coating film to cause the metal film to substantially enter the openings.

2. The method, as set forth in claim 1, wherein the surface coating film forming step comprises the step of forming a thin layer of anti-reflective coating over the metal layer.

3. The method, as set forth in claim 1, wherein the surface coating film forming step comprises the step of depositing a layer of titanium nitride over the metal layer.

4. The method, as set forth in claim 1, wherein the surface coating film forming step comprises the step of forming a layer of aluminum oxide over the metal layer.

5. The method, as set forth in claim 1, wherein the surface coating film forming step comprises the steps of:
   forming a first surface coating layer of a first material over the fill metal layer; and
   forming a second surface coating layer of a second material over the first surface coating layer.

6. The method, as set forth in claim 1, wherein the surface coating film forming step (c) comprises the steps of:
   forming a first surface coating layer of titanium over the metal layer; and
   forming a second surface coating layer of titanium nitride over the titanium layer.

7. The method, as set fort in claim 1, further comprising the step of forming at least one barrier layer along the bottom surface and the plurality of side surfaces of the openings prior to forming the metal layer of a step (b).

8. The method, as in claim 7 wherein a first barrier layer is titanium and a second barrier layer is titanium nitride.

9. The method of claim 1 wherein the metal film is aluminum.

10. The method, as set forth in claim 9, wherein the surface coating film forming step comprises the step of exposing the wafer to oxygen and thereby forming a layer of aluminum oxide over the aluminum metal layer.

11. The method, as set forth in claim 9, wherein the surface coating film forming step comprises the step of exposing the wafer to nitrogen and thereby forming a layer of aluminum nitride over the aluminum metal layer.

12. A method of filling contacts and vias, comprising the steps of:
   (a) forming openings in an interlevel dielectric film by forming the openings to have a plurality of side surfaces and a bottom surface;
   (b) forming at least one barrier layer along the bottom surface and the plurality of side surfaces of the openings;
   (c) forming at least one metal film of a first material on the barrier layer with the metal film covering the openings and not substantially entering the openings to form a gap in the openings;
   (d) forming at least one surface coating film of a second material different from the first material over the metal film said surface coating film having the property of minimizing shear forces exerted on the metal film; and
   (e) applying pressure greater than atmospheric pressure to the surface coating film such that the metal film substantially fills the openings.

13. The method of claim 12 wherein the metal film is aluminum.

14. The method, as set forth in claim 12, wherein the surface coating film forming step comprises the step of forming a layer of anti-reflective coating over the metal layer.

15. The method, as set forth in claim 12, wherein the surface coating film forming step comprises the step of depositing a layer of titanium nitride over the metal layer.

16. The method, as set forth in claim 13, wherein the surface coating film forming step comprises the step of exposing the wafer to oxygen thereby forming a layer of aluminum oxide over the aluminum metal layer.

17. The method of claim 13, wherein the surface coating film forming step comprises the step of exposing the wafer to nitrogen thereby forming a layer of aluminum nitride over the aluminum metal layer.

18. The method, as set forth in claim 12, wherein the surface coating film forming step comprises the steps of:

forming a first surface coating layer of a first material over the fill metal layer; and forming a second surface coating layer of a second material over the first surface coating layer.

19. The method, as set forth in claim 12, wherein the surface coating film forming step comprises the steps of:

forming a first surface coating layer of titanium over the metal layer; and forming a second surface coating layer of titanium nitride over the titanium layer.

20. The method, as in claim 12 wherein a first barrier layer is titanium and a second barrier layer is titanium nitride.

* * * * *